(12) United States Patent
Song

(10) Patent No.: US 11,506,715 B2
(45) Date of Patent: Nov. 22, 2022

(54) SWITCH DIAGNOSING APPARATUS AND METHOD

(71) Applicant: LG Chem, Ltd., Seoul (KR)

(72) Inventor: Hyeon-Jin Song, Daejeon (KR)

(73) Assignee: LG Energy Solution, Ltd.

( * ) Notice: Subject to any disclaimer, the term of this patent is extended or adjusted under 35 U.S.C. 154(b) by 188 days.

(21) Appl. No.: 16/963,918

(22) PCT Filed: Jul. 10, 2019

(86) PCT No.: PCT/KR2019/008501
§ 371 (c)(1),
(2) Date: Jul. 22, 2020

(87) PCT Pub. No.: WO2020/017817
PCT Pub. Date: Jan. 23, 2020

(65) Prior Publication Data
US 2021/0041502 A1 Feb. 11, 2021

(30) Foreign Application Priority Data

Jul. 17, 2018 (KR) .................. 10-2018-0083091

(51) Int. Cl.
G01R 31/327 (2006.01)
G01R 27/08 (2006.01)
(Continued)

(52) U.S. Cl.
CPC .............. *G01R 31/327* (2013.01); *G01K 7/22* (2013.01); *G01R 19/10* (2013.01); *G01R 27/08* (2013.01);
(Continued)

(58) Field of Classification Search
CPC .. G01R 31/00; G01R 31/327; G01R 31/3277; G01R 31/50; G01R 31/52; G01R 31/54;
(Continued)

(56) References Cited

U.S. PATENT DOCUMENTS

2002/0113574 A1* 8/2002 Mashiko ............... H02J 7/0031
320/128
2006/0139007 A1* 6/2006 Kim ...................... H02J 7/0029
320/134
(Continued)

FOREIGN PATENT DOCUMENTS

CN 102282622 A 12/2011
CN 103296715 A 9/2013
(Continued)

OTHER PUBLICATIONS

International Search Report for PCT/KR2019/008501 dated Oct. 25, 2019; 2 pages.
(Continued)

*Primary Examiner* — Hoai-An D. Nguyen
(74) *Attorney, Agent, or Firm* — Lerner, David, Littenberg, Krumholz & Mentlik, LLP

(57) ABSTRACT

A switch diagnosing apparatus and method capable of effectively diagnosing a charging switch and a discharging switch provided to a battery pack. It is possible to effectively diagnose the state of a switch as at least one of a normal state, an open stuck state, a closed stuck state and a drift state, thereby improving the diagnosing efficiency.

20 Claims, 5 Drawing Sheets

(51) Int. Cl.
  *G01R 19/10* (2006.01)
  *G01K 7/22* (2006.01)
  *H02J 7/00* (2006.01)
(52) U.S. Cl.
  CPC .......... *H02J 7/0013* (2013.01); *H02J 7/0031* (2013.01); *H02J 7/0047* (2013.01)
(58) Field of Classification Search
  CPC ........ G01R 27/00; G01R 27/02; G01R 27/08; G01R 19/00; G01R 19/10; G01R 19/165; G01R 19/16566; G01R 19/16571; G01R 19/16576; G01R 11/00; G01R 11/30; G01R 11/32; G01R 11/34; G01K 7/00; G01K 7/16; G01K 7/22; H02J 7/00; H02J 7/0013; H02J 7/0029; H02J 7/0031; H02J 7/0047; H01M 10/00; H01M 10/42; H01M 10/425; H01M 2010/4271; Y02E 60/00; Y02E 60/10
  See application file for complete search history.

(56) References Cited

U.S. PATENT DOCUMENTS

| | | |
|---|---|---|
| 2008/0143298 A1 | 6/2008 | Yoshida |
| 2008/0278116 A1 | 11/2008 | Matsunaga |
| 2010/0073067 A1 | 3/2010 | Honea |
| 2010/0188894 A1 | 7/2010 | Rao et al. |
| 2012/0068546 A1 | 3/2012 | Kuramochi et al. |
| 2012/0166841 A1 | 6/2012 | Holsen et al. |
| 2013/0229186 A1 | 9/2013 | Shiraishi et al. |
| 2013/0257515 A1 | 10/2013 | Ladurner et al. |
| 2013/0271146 A1 | 10/2013 | Sakabe et al. |
| 2016/0231382 A1 | 8/2016 | Hirose et al. |
| 2016/0282415 A1 | 9/2016 | Shiraishi et al. |
| 2016/0301224 A1 | 10/2016 | Kim |
| 2017/0104407 A1 | 4/2017 | Boncato et al. |
| 2017/0279443 A1 | 9/2017 | Morimoto |
| 2018/0123584 A1 | 5/2018 | Morimoto |
| 2018/0188326 A1 | 7/2018 | Huh et al. |

FOREIGN PATENT DOCUMENTS

| | | |
|---|---|---|
| CN | 103368559 A | 10/2013 |
| CN | 104300947 A | 1/2015 |
| CN | 106532628 A | 3/2017 |
| CN | 106569432 A | 4/2017 |
| EP | 3316462 A1 | 5/2018 |
| FR | 2991461 A1 | 12/2013 |
| JP | 2004103499 A | 4/2004 |
| JP | 200827826 A | 2/2008 |
| JP | 2008175804 A | 7/2008 |
| JP | 2008283743 A | 11/2008 |
| JP | 2010251104 A | 11/2010 |
| JP | 201270055 A | 4/2012 |
| JP | 201290474 A | 5/2012 |
| JP | 2012100438 A | 5/2012 |
| JP | 5076812 B2 | 11/2012 |
| JP | 2013181822 A | 9/2013 |
| JP | 5652562 B1 | 1/2015 |
| JP | 201584631 A | 4/2015 |
| JP | 2016118571 A | 6/2016 |
| JP | 2016127769 A | 7/2016 |
| JP | 2017103683 A | 6/2017 |
| JP | 2017183764 A | 10/2017 |
| JP | 2018026908 A | 2/2018 |
| JP | 2018072155 A | 5/2018 |
| KR | 20130100740 A | 9/2013 |
| KR | 20130103531 A | 9/2013 |
| KR | 20150040575 A | 4/2015 |
| KR | 20160041495 A | 4/2016 |
| KR | 20170098049 A | 8/2017 |

OTHER PUBLICATIONS

Extended European Search Report including Written Opinion for Application No. 19837588.3 dated Mar. 9, 2021, 9 pages.
Search Report dated Feb. 9, 2022 from the Office Action for Chinese Application No. 2019800096113 dated Feb. 16, 2022, 2 pages.

* cited by examiner

SWITCH DIAGNOSING APPARATUS AND METHOD

CROSS-REFERENCE TO RELATED APPLICATIONS

The present application is a national phase entry under 35 U.S.C. § 371 of International Application No. PCT/KR2019/008501 filed Jul. 10, 2019, published in Korean, which claims priority from Korean Patent Application No. 10-2018-0083091 filed Jul. 17, 2018, all of which are incorporated herein by reference.

TECHNICAL FIELD

The present disclosure relates to a switch diagnosing apparatus and method, and more particularly, to a switch diagnosing apparatus and method capable of effectively diagnosing a switch during a process of diagnosing a charging switch and a discharging switch provided to a battery pack.

BACKGROUND ART

In recent years, the demand for portable electronic products such as notebook computers, video cameras and portable phones has increased sharply, and the energy storage batteries, robots and satellites has been active developed. Accordingly, high-performance secondary batteries allowing repeated charging and discharging are being actively studied.

Accordingly, as the technology development and demand for mobile devices, electric vehicles, hybrid electric vehicles, power storage devices and uninterruptible power supplies have increased, the demand for secondary batteries as an energy source is rapidly increasing. In particular, secondary batteries used in electric vehicles or hybrid electric vehicles are high-power, high-capacity secondary batteries, and many studies have been conducted thereon.

In addition, along with a great demand for secondary batteries, peripheral components and devices related to secondary batteries have been studied. That is, various parts and devices such as a battery module prepared by connecting a plurality of secondary batteries into a single module, a battery management system (BMS) for controlling charge and discharge of the battery module and monitoring a state of each secondary battery, a battery pack prepared to include the battery module and the BMS into a single pack and a switch for connecting the battery module to a load such as a motor are being studied.

In particular, the switch is used to connect a battery module and a load and control whether or not to supply power and is being intensively studied. As an example, a lithium ion secondary battery widely used in the art has an operating voltage of about 3.7V to 4.2V. In order to provide a high voltage, a plurality of secondary batteries are connected in series to form the battery module. The switch for connecting the battery module and the motor is a component through which high-voltage, high-output electrical energy passes at all times. Thus, it is very important to monitor the occurrence of a fault such as an open stuck state, a closed stuck state and a drift state.

Meanwhile, for a variety of devices that require electrical energy, such as electric vehicles, a power system is essential. The power system is responsible for providing a stable power supply between a battery and a load by selectively opening and closing at least one switch. With regard to the safety of the power system, it is necessary to diagnose the occurrence of an external short accident. If an external short accident occurs, there is a risk of sudden unintended acceleration of a vehicle or the like.

SUMMARY

Technical Problem

The present disclosure is designed to solve the problems of the related art, and therefore the present disclosure is directed to providing an improved switch diagnosing apparatus and method, which may effectively diagnose a switch during a process of diagnosing a charging switch and a discharging switch provided to a battery pack.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a switch diagnosing apparatus, which diagnoses a first charging switch and a first discharging switch on a charging and discharging path of a cell assembly and connected in series with each other.

The switch diagnosing apparatus may comprise: a voltage measuring unit configured to measure voltages at both ends of the first charging switch and the first discharging switch; a current measuring unit configured to measure a current flowing through the charging and discharging path; and a processor configured to selectively control the first charging switch and the first discharging switch to be opened or closed, receive the measured voltages at both ends of at least one of the first charging switch or the first discharging switch from the voltage measuring unit, receive the measured current from the current measuring unit, and diagnose a state of at least one of the first charging switch or the first discharging switch as at least one of a normal state, an open stuck state, a closed stuck state and a drift state based on at least one of the measured voltages and the measured current.

The switch diagnosing apparatus according to another embodiment of the present disclosure may further comprise a diagnosis power unit having one end electrically connected to the charging and discharging path to supply a diagnosis power to at least one of the first charging switch or the first discharging switch.

The processor may be configured to calculate a normal voltage difference across the first charging switch and a normal voltage difference across the first discharging switch based on current information of the diagnosis power output by the diagnosis power unit and previously stored resistance information of each of the first charging switch and the first discharging switch.

The processor may be configured to calculate a measured voltage difference across the first charging switch based on the measured voltages at both ends of the first charging switch.

The processor may be configured to calculate a measured voltage difference across the first discharging switch based on the measured voltages at both ends of the first discharging switch.

The processor may be configured to diagnose whether the state of the first charging switch is the open stuck state based on a comparison between the measured voltage difference across the first charging switch and the normal voltage difference of the first charging switch.

The processor may be configured to diagnose whether the state of the first discharging switch is the open stuck state based on a comparison between the measured voltage difference across the first discharging switch and the normal voltage difference of the first discharging switch.

The processor may be configured to calculate a measured voltage difference across the first charging switch based on the measured voltages at both ends of the first charging switch and a measured voltage difference across the first discharging switch based on the measured voltages at both ends of the first discharging switch and diagnose the state of at least one of the first charging switch and the first discharging switch as at least one of a normal state, an open stuck state and a closed stuck state based on the calculated measured voltage difference across the first charging switch and the calculated measured voltage difference across the first discharging switch.

The charging switch may further comprise a plurality of charging switches including the first charging switch connected in parallel with each other.

The discharging switch may further comprise a plurality of discharging switches including the first discharging switch connected in parallel with each other.

The switch diagnosing apparatus may further comprise a temperature measuring unit positioned adjacent to each of the plurality of charging switches and the plurality of discharging switches to measure a temperature of each of the plurality of charging switches and the plurality of discharging switches.

The processor may be configured to receive the measured temperatures of each of the plurality of charging switches and the plurality of discharging switches from the temperature measuring unit, and diagnose the state of each of the plurality of charging switches and the plurality of discharging switches based on the received measured temperatures and measured voltage differences across each of the plurality of charging switches and the plurality of discharging switches.

The voltage measuring unit may be electrically connected to a first measurement point between a first end of the charging switch and a first end of the discharging switch, a second measurement point at a second end of the charging switch and a third measurement point at a second end of the discharging switch to measure a voltage of each of the first, second and third measurement points.

The processor may be configured to diagnose the state of at least one of the charging switch or the discharging switch based on the measured voltages of each of the first, second and third measurement points.

The processor may be configured to calculate a current integration value by integrating the measured current during a preset reference time, and calculate each of an accumulated voltage drop of the charging switch and an accumulated voltage drop of the discharging switch during the reference time based on the measured voltages at both ends of the first charging switch and the first discharging switch.

The processor may be configured to calculate a composite resistance of the charging switch by dividing the accumulated voltage drop of the charging switch by the current integration value.

The processor may be configured to calculate a composite resistance of the discharging switch by dividing the accumulated voltage drop of the discharging switch by the current integration value.

The processor may be configured to diagnose at least one of whether the state of the charging switch is the drift state based on the calculated composite resistance of the charging switch or whether the state of the discharging switch is the drift state based on the calculated composite resistance of the discharging switch.

The switch diagnosing apparatus according to another embodiment of the present disclosure may further comprise a diagnosis signaling unit electrically connected to the processor and configured to transmit an external short signal to the processor.

The processor may be configured to determine that an external short occurs when the external short signal is received from the diagnosis signaling unit, and diagnose whether the charging switch and the discharging switch are normally opened in response to determination of an occurrence of an external short.

When the external short signal is received from the diagnosis signaling unit, the processor may be configured to transmit a turn-off command to each of the charging switch and the discharging switch, and diagnose whether the charging switch and the discharging switch are normally opened based on the measured the measured voltages at both ends of the first charging switch and the first discharging switch.

In another aspect of the present disclosure, there is also provided a battery management system (BMS), comprising the switch diagnosing apparatus according to any of the embodiments of the present disclosure.

In another aspect of the present disclosure, there is also provided a battery pack, comprising the switch diagnosing apparatus according to any of the embodiments of the present disclosure.

In another aspect of the present disclosure, there is also provided a switch diagnosing method, which diagnoses a charging switch and a discharging switch on a charging and discharging path of a cell assembly and connected in series with each other, the method comprising: measuring voltages at both ends of the charging switch and at both ends of the discharging switch, respectively; measuring a current flowing through the charging and discharging path; selectively controlling the charging switch and the discharging switch to be opened or closed; receiving the measured voltages at both ends of the charging switch and the discharging switch; receiving the measured current; and diagnosing a state of at least one of the charging switch or the discharging switch as at least one of a normal state, an open stuck state, a closed stuck state and a drift state based on at least one of the measured voltages and the measured current.

Advantageous Effects

According to an embodiment of the present disclosure, by using a measured voltage value and a measured current value, it is possible to effectively diagnose the state of a switch as at least one of a normal state, an open stuck state, a closed stuck state and a drift state, thereby improving the diagnosing efficiency.

Also, according to an embodiment of the present disclosure, it is possible to effectively diagnose whether a fault occurs at a specific switch among a plurality of switches by using a measured temperature value.

In particular, according to an embodiment of the present disclosure, by detecting a change in resistance of the switch while the vehicle is running to diagnose whether the switch is in a drift state, it is possible to provide an improved switch diagnosing apparatus and method, which may prevent an accident that may occur while driving.

In addition, according to an embodiment of the present disclosure, by diagnosing whether the switch operates normally in a situation that simulates an actual external short, it is possible to provide a switch diagnosis result prepared for the case where an actual external short occurs.

The present disclosure may have various effects other than the above, and other effects of the present disclosure may be understood from the following description and more clearly figured out by the embodiments of the present disclosure.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Further, in describing the present disclosure, if it is determined that a detailed description of a related known structure or function may obscure the subject matter of the present disclosure, the detailed description will be omitted.

Throughout the specification, when a portion is referred to as "comprising" or "including" any element, it means that the portion may include other elements further, without excluding other elements, unless specifically stated otherwise. Furthermore, the term "processor" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

In the specification, a secondary battery means one independent cell that has a cathode terminal and a cathode terminal and is physically separable. For example, one pouch-type lithium polymer cell may be considered as a secondary battery.

A switch diagnosing apparatus according to an embodiment of the present disclosure may be a device for diagnosing a charging switch 50 and a discharging switch 30 included in a battery pack. More specifically, the switch diagnosing apparatus according to an embodiment of the present disclosure is provided on a charging and discharging path L of a cell assembly 10 included in the battery pack to diagnose the charging switch 50 and the discharging switch 30 connected in series with each other. For example, the cell assembly 10 may be a lithium ion battery having at least one secondary battery cell.

Figure 1:
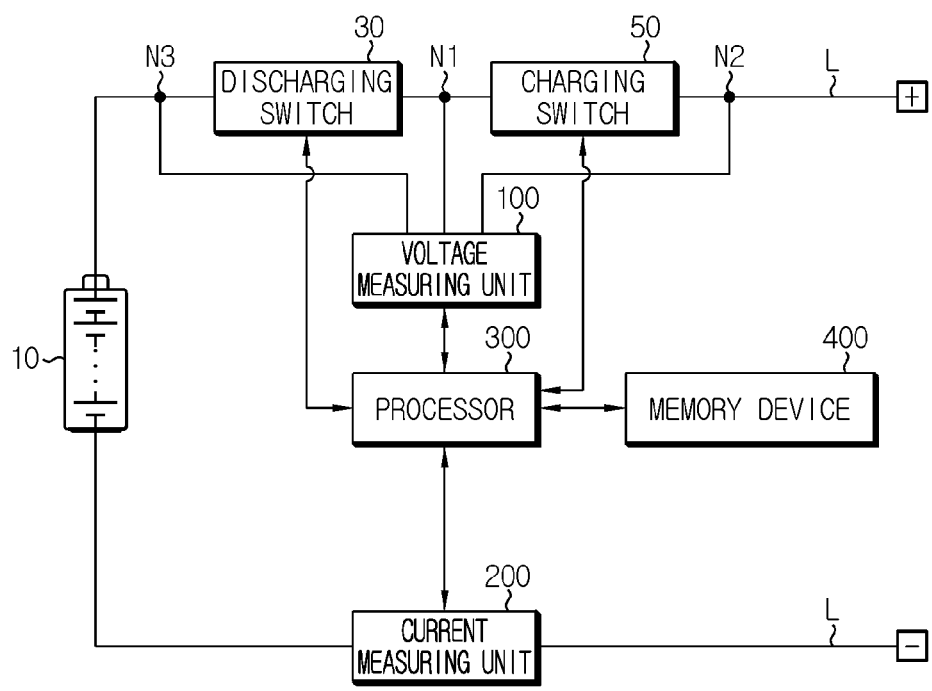
FIG. 1 is a diagram schematically showing a functional configuration of a switch diagnosing apparatus according to an embodiment of the present disclosure.

For example, as shown in the configuration of FIG. 1, the switch diagnosing apparatus according to an embodiment of the present disclosure may include the charging switch 50 and the discharging switch 30 connected in series with each other on the charging and discharging path L for supplying a charging and discharging current to the cell assembly 10. Here, the switch diagnosing apparatus according to an embodiment of the present disclosure may include a plurality of charging switches 50 connected in parallel with each other. In addition, the switch diagnosing apparatus may include a plurality of discharging switches 30 connected in parallel with each other.

The charging switch 50 may open and close the charging and discharging path L so that a current flows in the direction of charging the cell assembly 10. For example, the charging switch 50 may be located on the charging and discharging path L between a positive electrode terminal of the cell assembly 10 and a positive electrode terminal of the battery pack to open and close the charging and discharging path L so that a current flows in the direction of charging the cell assembly 10.

The discharging switch 30 may open and close the charging and discharging path L so that a current flows in the direction of discharging the cell assembly 10. For example, the discharging switch 30 may be located on the charging and discharging path L between the positive electrode terminal of the cell assembly 10 and the positive electrode terminal of the battery pack to open and close the charging and discharging path L so that a current flows in the direction of discharging the cell assembly 10.

For example, in the switch diagnosing apparatus according to an embodiment of the present disclosure, as shown in the configuration of FIG. 1, the charging switch 50 and the discharging switch 30 may be connected in series such that one end of the discharging switch 30 may be directly connected to the positive electrode terminal of the cell assembly 10, and one end of the charging switch 50 may be directly connected to the positive electrode terminal of the battery pack.

For example, the charging switch 50 and the discharging switch 30 according to an embodiment of the present disclosure may be a field effect transistor (FET) element having gate, drain and source terminals. Here, the FET element may be turned on or off depending on whether a channel is formed according to a voltage applied between the gate terminal and the source terminal. If the channel is formed, a current may flow from the drain terminal to the source terminal or from the source terminal to the drain terminal. That is, a current may flow in both directions through the formed channel. For example, the FET element may be a metal oxide semiconductor field effect transistor (MOSFET).

FIG. 1 is a diagram schematically showing a functional configuration of a switch diagnosing apparatus according to an embodiment of the present disclosure.

Referring to FIG. 1, the switch diagnosing apparatus according to an embodiment of the present disclosure includes a voltage measuring unit 100, a current measuring unit 200 and a processor 300.

The voltage measuring unit 100 may be electrically connected to a first measurement point N1 between the charging switch 50 and the discharging switch 30, a second measurement point N2 at the other end of the charging switch 50 and a third measurement point N3 at the other end of the discharging switch 30, respectively. For example, as shown in FIG. 1, the voltage measuring unit 100 may be electrically connected to both ends of the discharging switch 30 and the charging switch 50, respectively, so as to transmit and receive an electric signal.

In addition, the voltage measuring unit 100 may be configured to measure voltages of the first measurement point N1, the second measurement point N2 and the third measurement point N3. More specifically, the voltage measuring unit 100 may measure the voltages of the first measurement point N1, the second measurement point N2 and the third measurement point N3 based on electric signals received from the first measurement point N1, the second measurement point N2 and the third measurement point N3.

Preferably, the voltage measuring unit 100 may be electrically connected to the processor 300 to transmit and receive an electric signal. In addition, the voltage measuring unit 100 may measure the voltages of the first measurement point N1, the second measurement point N2 and the third measurement point N3 at time intervals under the control of the processor 300, and output a signal indicating the magnitude of the measured voltage to the processor 300. Also, the voltage measuring unit 100 may measure both-end voltages of the discharging switch 30 and the charging switch 50. For example, the voltage measuring unit 100 may be implemented using a voltage measuring circuit generally used in the art.

The current measuring unit 200 may be provided on the charging and discharging path L to measure a current flowing through the charging and discharging path L. For example, the current measuring unit 200 according to an embodiment of the present disclosure may be electrically connected to a current sensor provided on the charging and discharging path L connected to the cell assembly 10 to receive an electric signal from the current sensor. In addition, the current measuring unit 200 may be configured to measure a charging and discharging current flowing through the charging and discharging path L based on the electric signal received from the current sensor.

For example, as shown in the configuration of FIG. 1, the current measuring unit 200 according to an embodiment of the present disclosure may be provided on the charging and discharging path L. In addition, the current measuring unit 200 according to an embodiment of the present disclosure may be electrically connected to both ends of the current sensor provided on the charging and discharging path L.

Here, the current sensor may be electrically connected between a negative electrode terminal of the cell assembly 10 and a negative electrode terminal of the battery pack. In addition, the current measuring unit 200 may measure a both-end voltage of the current sensor and measure the current flowing through the charging and discharging path L based on the both-end voltage of the current sensor. For example, the current measuring unit 200 may measure the current flowing through the charging and discharging path L using the Ohm's law based on the resistance of the current sensor and the both-end voltage of the current sensor.

Preferably, the current measuring unit 200 may be electrically connected to the processor 300 to transmit and receive an electric signal. In addition, the current measuring unit 200 may repeatedly measure the magnitude of the charging current or the discharging current of the cell assembly 10 at time intervals under the control of the processor 300, and output a signal indicating the magnitude of the measured current to the processor 300. For example, the current measuring unit 200 may be implemented using a hall sensor or a sense resistor generally used in the art.

The processor 300 may be connected to the voltage measuring unit 100 and the current measuring unit 200 to transmit or receive an electric signal with each other. In addition, the processor 300 may receive the measured voltage values of the first measurement point N1, the second measurement point N2 and the third measurement point N3 from the voltage measuring unit 100, respectively. Also, the processor 300 may receive the measured current value flowing through the charging and discharging path L from the current measuring unit 200.

In addition, the processor 300 may be connected to the charging switch 50 and the discharging switch 30 to transmit and receive an electric signal, respectively, so that the charging switch 50 and the discharging switch 30 are selectively controlled to be opened or closed. Also, the processor 300 may diagnose the state of at least one of the charging switch 50 and the discharging switch 30 as at least one of a normal state, an open stuck state, a closed stuck state and a drift state based on at least one of the measured voltage values of the first measurement point N1, the second measurement point N2 and the third measurement point N3 and the measured current value flowing through the charging and discharging path L.

In addition, the processor 300 may output a switch diagnosis result obtained by diagnosing the charging switch 50 and the discharging switch 30 to the outside. In this case, a user may check the state of the switch by receiving the switch diagnosis result from the processor 300.

Preferably, as shown in the configuration of FIG. 1, the switch diagnosing apparatus according to an embodiment of the present disclosure may further include a memory device 400.

The memory device 400 may be electrically connected to the processor 300 to transmit and receive an electric signal. In addition, the memory device 400 may store information necessary for controlling the discharging switch 30 and the charging switch 50 in advance. For example, the memory device 400 may store in advance a threshold voltage value that is a voltage value at which the discharging switch 30 and the charging switch 50 are turned on.

Meanwhile, the processor 300 may be implemented to include a processor 300, an application-specific integrated circuit (ASIC), another chipset, a logic circuit, a register, a communication modem, and/or a data processing device known in the art, selectively.

Meanwhile, the memory device 400 is not particularly limited as long as it is a storage medium capable of recording and erasing information. For example, the memory device 400 may be a RAM, a ROM, a register, a hard disk, an optical recording medium, or a magnetic recording medium. The memory device 400 may also be electrically connected to the processor 300 via, for example, a data bus so as to be accessible by the processor 300. The memory device 400 may also store and/or update and/or erase and/or transmit a program including various control logics executed by the processor 300 and/or data generated by executing the control logics.

Figure 2:
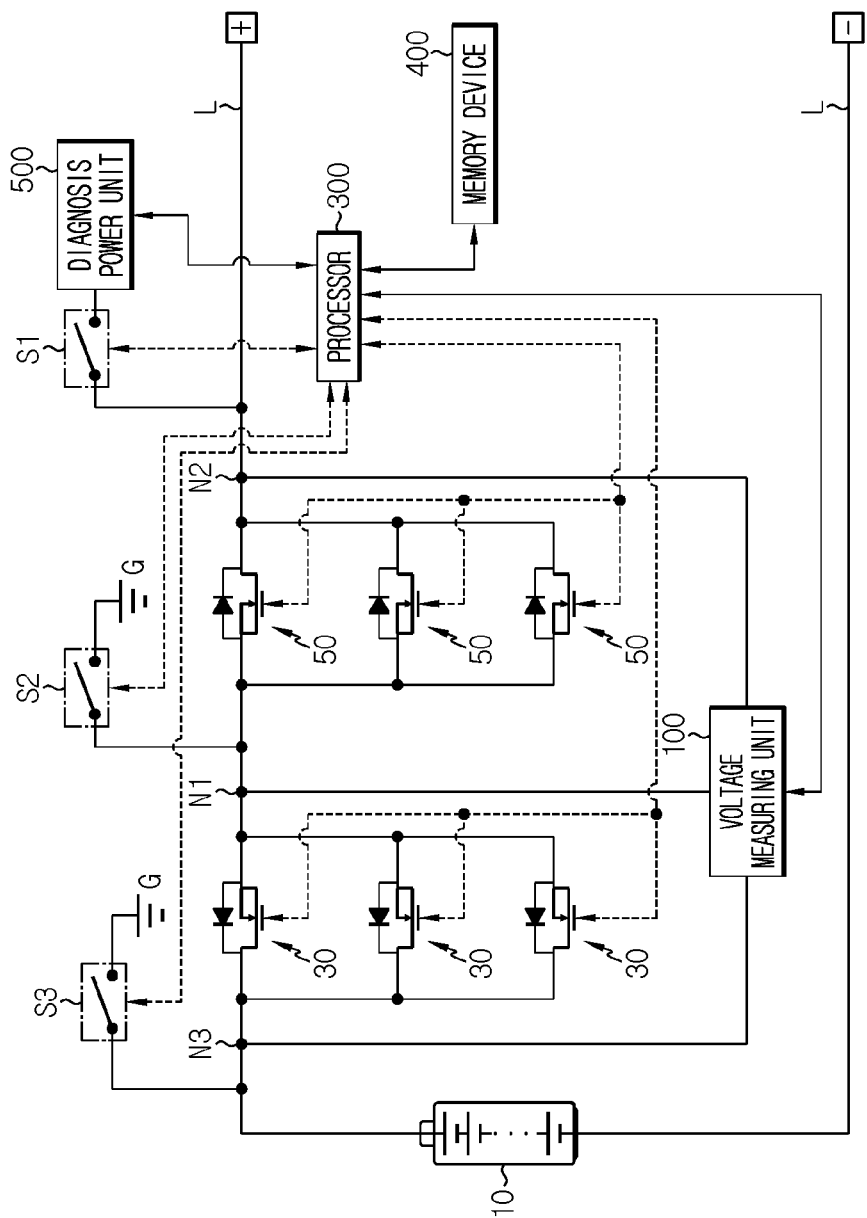
FIG. 2 is a diagram schematically showing a configuration of the switch diagnosing apparatus according to an embodiment of the present disclosure.
Figure 3:
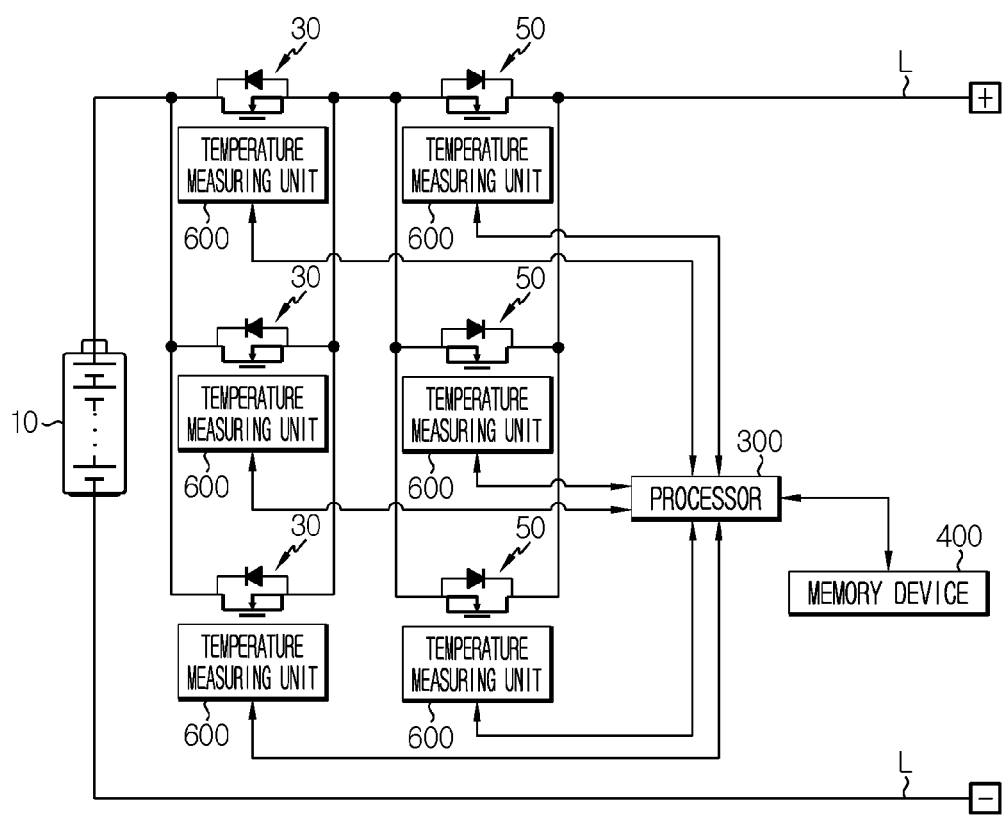
FIG. 3 is a diagram schematically showing a configuration of a switch diagnosing apparatus according to another embodiment of the present disclosure.

FIG. 2 is a diagram schematically showing a configuration of the switch diagnosing apparatus according to an embodiment of the present disclosure, and FIG. 3 is a diagram schematically showing a configuration of a switch diagnosing apparatus according to another embodiment of the present disclosure.

First, referring to FIG. 2, the switch diagnosing apparatus according to an embodiment of the present disclosure may include a diagnosis power unit 500.

One end of the diagnosis power unit 500 may be electrically connected to the charging and discharging path L. For example, as shown in the configuration of FIG. 2, one end of the diagnosis power unit 500 may be electrically connected between the second measurement point N2 on the charging and discharging path L and the positive electrode terminal of the battery pack.

In addition, the diagnosis power unit 500 may supply a diagnosis power to at least one of the charging switch 50 and the discharging switch 30. For example, the diagnosis power unit 500 may generate a diagnosis power and supply the diagnosis power to at least one of the charging switch 50 and the discharging switch 30. Here, as the diagnosis power, a current having a current value of 1 ampere [A] may be supplied. For example, when the switch diagnosing apparatus according to an embodiment of the present disclosure is provided in a vehicle, the diagnosis power unit 500 may be a boost converter circuit powered by a 12V battery of the vehicle. In this case, the diagnosis power unit 500 may convert the 12V power of the vehicle into 60V/1 A and output the same as the diagnosis power.

Preferably, as shown in the configuration of FIG. 2, the switch diagnosing apparatus according to an embodiment of the present disclosure may include diagnosis switches S1, S2, S3.

As shown in the configuration of FIG. 2, the first diagnosis switch S1 may be provided to a first diagnosing circuit having one end connected to the charging and discharging path L and the other end connected to the diagnosis power unit 500. For example, the first diagnosing circuit may be directly connected between the second measurement point N2 and the positive electrode terminal of the battery pack. In addition, the first diagnosis switch S1 may open and close the first diagnosing circuit so that the diagnosis power flows through the charging and discharging path L.

As shown in the configuration of FIG. 2, the second diagnosis switch S2 may be provided to a second diagnosing circuit having one end connected to the charging and discharging path L and the other end connected to the ground. For example, the second diagnosing circuit may be connected directly between the first measurement point N1 and one end of the charging switch 50. In addition, the second diagnosis switch S2 may open and close the second diagnosing circuit so that the diagnosis power flows to the second diagnosing circuit.

As shown in the configuration of FIG. 2, the third diagnosis switch S3 may be provided to a third diagnosing circuit having one end connected to the charging and discharging path L and the other end connected to the ground. For example, the third diagnosing circuit may be connected directly between the third measurement point N3 and the positive electrode terminal of the cell assembly 10. In addition, the third diagnosis switch S3 may open and close the third diagnosing circuit so that the diagnosis power flows to the third diagnosing circuit.

The diagnosis switches S1, S2, S3 may be electrically connected to the processor 300 to transmit and receive an electric signal. In addition, the diagnosis switches S1, S2, S3 may receive a control command from the processor 300 and open or close the diagnosing circuit based on the control command received from the processor 300.

Preferably, as shown in the configuration of FIG. 2, the switch diagnosing apparatus according to an embodiment of the present disclosure may include a plurality of charging switches 50 and a plurality of discharging switches 30.

For example, seeing the embodiment of FIG. 2, the plurality of charging switches 50 may include a first charging switch, a second charging switch and a third charging switch connected in parallel with each other. In addition, the plurality of discharging switches 30 may include a first discharging switch, a second discharging switch and a third discharging switch connected in parallel with each other. As above, in the embodiment of FIG. 2, the plurality of charging switches 50 and the plurality of discharging switches 30 are illustrated as being provided in the number of three, respectively, but the number of the plurality of charging switches 50 and the plurality of discharging switches 30 is not specially limited.

The plurality of discharging switches 30 and the plurality of charging switches 50 may be electrically connected to the processor 300 to transmit and receive an electric signal. In addition, the plurality of discharging switches 30 and the plurality of charging switches 50 may receive a control command from the processor 300, and open and close the charging and discharging path L based on the control command received from the processor 300.

Preferably, the processor 300 according to an embodiment of the present disclosure may control the power supply of the diagnosis power unit 500. For example, in the embodiment of FIG. 2, the processor 300 may control the power supply of the diagnosis power unit 500 by turning on the first diagnosis switch S1. More specifically, the processor 300 may turn on the first diagnosis switch S1 so that the diagnosis power supplied from the diagnosis power unit 500 is transferred to the charging and discharging path L. Subsequently, the processor 300 may turn on the charging switch 50 and the second diagnosis switch S2 to transfer the diagnosis power to the second diagnosing circuit. In this case, the diagnosis power may flow to the ground via the charging switch 50 and the second diagnosis switch S2. In addition, the processor 300 may turn on the charging switch 50 and the third diagnosis switch S3 and turn off the second diagnosis switch S2 to transfer the diagnosis power to the third diagnosing circuit. In this case, the diagnosis power may flow to the ground via the charging switch 50, the discharging switch 30 and the third diagnosis switch S3.

In addition, the processor 300 may calculate both-end voltage differences of the charging switch 50 and the discharging switch 30 based on the measured voltage values of the first measurement point N1, the second measurement point N2 and the third measurement point N3, respectively. For example, the processor 300 may turn on the first diagnosis switch S1 and the second diagnosis switch S2 and transmit a turn-on command to the charging switch 50. In addition, the processor 300 may calculate a both-end voltage difference of the charging switch 50 based on the measured voltage values of the first measurement point N1 and the second measurement point N2. If the charging switch 50 is in the turn-on state, the measured voltage values of the first measurement point N1 and the second measurement point N2 are the same. However, if the charging switch 50 is in the turn-off state, the measured voltage values of the first measurement point N1 and the second measurement point N2 may be different due to a parasitic diode. Thus, the processor 300 may diagnose whether the state of the charging switch 50 is the open stuck state based on the comparison result of the calculated both-end voltage difference of the charging switch 50 and the normal state both-end voltage difference of the charging switch 50.

As another example, the processor 300 may turn on the first diagnosis switch S1, the third diagnosis switch S3 and the charging switch 50, and turn off the second diagnosis switch S2. In addition, the processor 300 may transmit a turn-on command to the discharging switch 30. The processor 300 may calculate the both-end voltage difference of the discharging switch 30 based on the measured voltage values of the first measurement point N1 and the third measurement point N3. If the discharging switch 30 is in the turn-on state, the measured voltage values of the first measurement point N1 and the third measurement point N3 are the same. However, if the discharging switch 30 is in the turn-off state, the measured voltage values of the first measurement point N1 and the third measurement point N3 may be different due to a voltage drop caused by the parasitic diode. Thus, the processor 300 may diagnose whether the state of the discharging switch 30 is the open stuck state based on the comparison result of the calculated both-end voltage difference of the discharging switch 30 and the normal state both-end voltage difference of the discharging switch 30.

In the above embodiment, the normal state both-end voltage difference of the charging switch 50 may be a voltage value calculated based on a previously stored turn-on state resistance of the charging switch 50 and a voltage calculated based on the diagnosis power. In addition, the normal state both-end voltage difference of the discharging switch 30 may be a voltage value calculated based on a previously stored turn-on state resistance of the discharging switch 30 and a voltage value calculated based on the diagnosis power. The turn-on state resistance of the charging switch 50 and the turn-on state resistance of the discharging switch 30 may be stored in advance in the memory device 400.

Specifically, the processor 300 may diagnose whether the state of the charging switch 50 is the open stuck state based on the both-end voltage difference of the charging switch 50. In this case, the processor 300 may calculate the normal state both-end voltage difference of the charging switch 50 using the Ohm's law based on the previously stored turn-on state resistance of the charging switch 50. For example, if the previously stored turn-on state resistance of the charging switch 50 is 1 mohm and the diagnosis power is 1 A, the processor 300 may calculate the normal state both-end voltage difference of the charging switch 50 to be 1 mV. In addition, the processor 300 may compares the measured both-end voltage difference and the normal state both-end voltage difference calculated based on the measured voltage values of the first measurement point N1 and the second measurement point N2, and diagnose that the charging switch 50 is in the open stuck state if the difference between the measured both-end voltage difference and the normal state both-end voltage difference is beyond a preset error range.

In addition, the processor 300 may diagnose whether the state of the discharging switch 30 is the open stuck state based on the both-end voltage difference of the discharging switch 30. In this case, the processor 300 may calculate the normal state both-end voltage difference of the discharging switch 30 using the Ohm's law based on the previously stored turn-on state resistance of the discharging switch 30. For example, if the turn-on state resistance of the pre-stored discharging switch 30 is 1 mohm and the diagnosis power is 1 A, the processor 300 may calculate the normal state both-end voltage difference of the discharging switch 30 to be 1 mV. In addition, the processor 300 may compare the measured both-end voltage difference and the normal state both-end voltage difference calculated based on the measured voltage values of the first measurement point N1 and the third measurement point N3, and diagnoses that the discharging switch 30 is in the open stuck state if the difference between the measured both-end voltage difference and the normal state both-end voltage difference is beyond a preset error range.

In addition, as shown in the configuration of FIG. 2, the processor 300 according to an embodiment of the present disclosure may diagnose whether the states of the charging switch 50 and the discharging switch 30 are in the open stuck state based on the composite resistance of the plurality of charging switches 50 and the plurality of discharging switches 30 connected in parallel.

For example, as shown in the configuration of FIG. 2, the switch diagnosing apparatus according to an embodiment of the present disclosure may include three charging switches 50 connected in parallel. In this case, if the turn-on state resistance of one charging switch 50 is 1 mohm, the composite resistance of the three charging switches 50 may be ⅓ mohm. Here, if the diagnosis power is 1 A, the processor 300 may calculate the normal state both-end voltage difference of three charging switches 50 to be ⅓ mV. In addition, the processor 300 may compare the measured both-end voltage difference and the normal state both-end voltage difference calculated based on the measured voltage values of the first measurement point N1 and the second measurement point N2, and diagnose that at least one of the three charging switches 50 is in the open stuck state if the difference between the measured both-end voltage difference and normal state both-end voltage difference is beyond a preset error range.

In another example, as shown in the configuration of FIG. 2, the switch diagnosing apparatus according to an embodiment of the present disclosure may include three discharging switches 30 connected in parallel. In this case, if the turn-on state resistance of one discharging switch 30 is 1 mohm, the composite resistance of the three discharging switches 30 may be ⅓ mohm. Here, if the diagnosis power is 1 A, the processor 300 may calculate the normal state both-end voltage difference of the three discharging switches 30 to be ⅓ mV. In addition, the processor 300 may compare the measured both-end voltage difference and the normal state both-end voltage difference calculated based on the measured voltage values of the first measurement point N1 and the third measurement point N3, and diagnose that at least one of the three discharging switches 30 is in the open stuck state if the difference between the measured both-end voltage difference and the normal state both-end voltage difference is beyond a preset error range.

Referring to FIGS. 2 and 3 together, the switch diagnosing apparatus according to an embodiment of the present disclosure may include a temperature measuring unit 600, as shown in the configuration of FIG. 3.

The temperature measuring unit 600 may be provided adjacent to the plurality of charging switches 50 and the plurality of discharging switches 30 to measure temperatures of the plurality of charging switches 50 and the plurality of discharging switches 30, respectively. For example, as shown in the configuration of FIG. 3, the temperature measuring unit 600 according to an embodiment of the present disclosure may be provided adjacent the first charging switch, the second charging switch, the third charging switch, the first discharging switch, the second discharging switch and the third discharging switch, respectively, and measure the temperature of each of the first charging switch, the second charging switch, the third charging switch, the first discharging switch, the second discharging switch and the third discharging switch.

In addition, the temperature measuring unit 600 may be provided adjacent to the plurality of charging switches 50 and the plurality of discharging switches 30 and electrically connected to the plurality of charging switches 50 and the plurality of discharging switches 30, respectively, to transmit and receive electric signals. Alternatively, the temperature measuring unit 600 may be mounted to the plurality of charging switches 50 and the plurality of discharging switches 30, respectively, and electrically connected to the plurality of charging switches 50 and the plurality of discharging switches 30, respectively. Through this configuration, the temperature measuring unit 600 may measure the temperatures of the plurality of charging switches 50 and the plurality of discharging switches 30, respectively.

Preferably, the temperature measuring unit 600 may be mounted on an integrated circuit board of a battery management system (BMS). In particular, the temperature measuring unit 600 may be attached onto the integrated circuit board. For example, the temperature measuring unit 600 may be a negative temperature coefficient (NTC) thermistor that is attached onto the integrated circuit board by soldering.

Preferably, the temperature measuring unit 600 may be electrically coupled to the processor 300 to transmit and receive an electric signal. In addition, the temperature measuring unit 600 may repeatedly measure the temperatures of the plurality of charging switches 50 and the plurality of discharging switches 30 at time intervals and output a signal indicating the measured temperature to the processor 300. For example, the temperature measuring unit 600 may be implemented using a thermocouple commonly used in the art.

Preferably, the processor 300 according to an embodiment of the present disclosure may receive the measured temperature values of the plurality of charging switches 50 and the plurality of discharging switches 30 from the temperature measuring unit 600. In addition, the processor 300 may diagnose the states of the plurality of charging switches 50 and the plurality of discharging switches 30 based on the measured temperature value received from the temperature measuring unit 600 and the both-end voltage differences of the charging switch 50 and the discharging switch 30.

Specifically, the processor 300 may diagnose whether at least one of the plurality of charging switches 50 is in the open stuck state or the closed stuck state based on the composite resistance of the plurality of charging switches 50 connected in parallel. In this case, the processor 300 may diagnose whether the state of a specific switch among the plurality of charging switches 50 is the open stuck state or the closed stuck state, based on each measured temperature value of the charging switch 50 received from the temperature measuring unit 600.

In addition, it is possible to diagnose whether the state of at least one of the plurality of discharging switches 30 is the open stuck state or the closed stuck state based on the composite resistance of the plurality of discharging switches 30 connected in parallel.

For example, if three charging switches 50 are connected in parallel, the processor 300 may diagnose that the charging switch 50 having the measured temperature value equal to or lower than a preset value among the three charging switches 50 is in the open stuck state.

In addition, the processor 300 according to an embodiment of the present disclosure may calculate the both-end voltage difference of the charging switch 50 and the both-end voltage difference of the discharging switch 30, respectively, based on the measured voltage values measured by the voltage measuring unit 100. In addition, the processor 300 may diagnose that the state of at least one of the charging switch 50 and the discharging switch 30 is at least one of the normal state, the open stuck state and the closed stuck state, based on the calculated both-end voltage difference of the charging switch 50 and the calculated both-end voltage difference of the discharging switch 30. At this time, the processor 300 may receive the measured temperature values of the plurality of charging switches 50 and the plurality of discharging switches 30 from the temperature measuring unit 600. In addition, the processor 300 may diagnose the state of each of the plurality of charging switches 50 and the plurality of discharging switches 30 based on the received measured temperature value and the both-end voltage difference of the plurality of charging switches 50 and the plurality of discharging switches 30.

Hereinafter, an example of diagnosing whether at least one of the charging switch 50 and the discharging switch 30 is in the closed stuck state based on the measured voltage values of the first measurement point N1, the second measurement point N2 and the third measurement point N3 will be described. However, even though it is described that the processor 300 diagnoses whether at least one of the charging switch 50 and the discharging switch 30 is in the closed stuck state, the processor 300 may also diagnose whether at least one of the charging switch 50 and the discharging switch 30 is in the open stuck state based on the measured voltage values of the first measurement point N1, the second measurement point N2 and the third measurement point N3.

In the embodiment of FIG. 2, the processor 300 may diagnose whether the discharging switch 30 is in the closed stuck state based on the measured voltage value of the first measurement point N1. More specifically, the processor 300 may transmit a turn-off command to the discharging switch 30 and diagnose whether the discharging switch 30 is in the closed stuck state by comparing the measured voltage value of the third measurement point N3 with the measured voltage value of the first measurement point N1.

For example, if a potential difference of the positive electrode terminal voltage of the cell assembly 10 is 48V, the measured voltage value of the third measurement point N3 may be measured as 48V. In this case, if the measured voltage value of the first measurement point N1 is 48V, the processor 300 may diagnose that the discharging switch 30 is in the closed stuck state.

In addition, the processor 300 may diagnose whether the charging switch 50 is in the closed stuck state based on the measured voltage value of the second measurement point N2. Preferably, the processor 300 may transmit a turn-off command to the charging switch 50. More preferably, the processor 300 may transmit a turn-off command to the charging switch 50 and transmit a turn-on command to the discharging switch 30. In addition, the processor 300 may diagnose whether the charging switch 50 is in the closed stuck state by comparing the measured voltage value of the third measurement point N3 with the measured voltage value of the second measurement point N2. Alternatively, the processor 300 may diagnose whether the charging switch 50 is in the closed stuck state by comparing the measured voltage value of the first measurement point N1 and the measured voltage value of the second measurement point N2.

For example, if the potential difference of the positive electrode terminal voltage of the cell assembly 10 is 48V, the measured voltage value of the third measurement point N3 may be measured as 48V. In this case, if the measured voltage value of the second measurement point N2 is 48V, the processor 300 may diagnose that the charging switch 50 is in the closed stuck state.

Specifically, if the charging switch 50 is in the turn-on state, a voltage drop caused by a parasitic diode provided to the charging switch 50 may not occur. That is, when the charging switch 50 and the discharging switch 30 are in the turn-on state, the measured voltage values of the first measurement point N1, the second measurement point N2 and the third measurement point N3 may be equally 48V.

Thus, the processor 300 may transmit a turn-on command to the discharging switch 30, transmit a turn-off command to the charging switch 50, and diagnose whether the charging switch 50 is in the closed stuck state based on whether the measured voltage values of the first measurement point N1 and the second measurement point N2 are the same.

Alternatively, the processor 300 may transmit a turn-on command to the discharging switch 30, transmit a turn-off command to the charging switch 50, and diagnose whether the charging switch 50 is in the closed stuck state based on whether the measured voltage values of the third measurement point N3 and the second measurement point N2 are the same.

Figure 4:
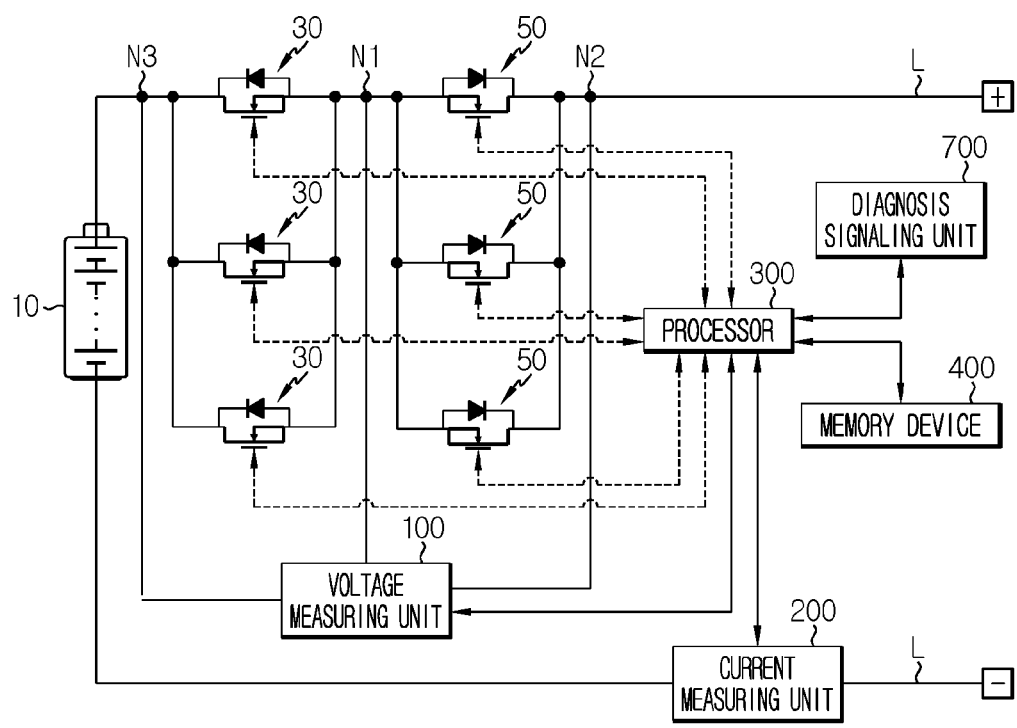
FIG. 4 s a diagram schematically showing a configuration of a switch diagnosing apparatus according to still another embodiment of the present disclosure.

FIG. 4 s a diagram schematically showing a configuration of a switch diagnosing apparatus according to still another embodiment of the present disclosure. Also, regarding this embodiment, features that may be applied similar to the former embodiment will not be described in detail, and features different from the former embodiment will be described in detail.

Referring to FIG. 4, the processor 300 according to an embodiment of the present disclosure may calculate a current integration value by integrating the measured current value during a preset reference time based on the measured current value. For example, the processor 300 may receive the measured current value from the current measuring unit 200. In addition, the processor 300 may calculate the current integration value by integrating the measured current value during the preset reference time using Equation 1 below.

$$\Delta I = \int_{t0}^{t1} i\, dt \qquad \text{<Equation 1>}$$

Here, ΔI may be a current integration value, t0 and t1 may be time, and i may be a measured current value. That is, Equation 1 is a formula for calculating a current integration value (ΔI) obtained by integrating a current (i) flowing through the current measuring unit 200 during a preset reference time (between the time t0 and the time t1).

In addition, the processor 300 may calculate an accumulated voltage drop of the charging switch 50 and the discharging switch 30 during the preset reference time based on the measured voltage values of the first measurement point N1, the second measurement point N2 and the third measurement point N3. For example, the processor 300 may calculate the accumulated voltage drop of the discharging switch 30 based on the measured voltage values of the first measurement point N1 and the third measurement point N3 during the preset reference time using Equation 2 below. In addition, the processor 300 may calculate the accumulated voltage drop of the charging switch 50 based on the measured voltage values of the first measurement point N1 and the second measurement point N2 during the preset reference time using Equation 2 below.

$$\Delta V = \int_{t0}^{t1} v\, dt \qquad \text{<Equation 2>}$$

Here, ΔV may be an accumulated voltage drop, t0 and t1 may be time, and v may be a voltage difference between the first measurement point N1 and the third measurement point N3 or a voltage difference between the first measurement point N1 and the second measurement point N2. That is, Equation 2 is a formula for calculating the accumulated voltage drop (ΔV) by integrating the voltage difference (v) of the first measurement point N1 and the third measurement point N3 or of the first measurement point N1 and the second measurement point N2 measured during the preset reference time (between the time t0 and the time t1).

In addition, the processor 300 may calculate the composite resistance of the charging switch 50 and the discharging switch 30 by dividing the accumulated voltage drop (ΔV) by the current integration value (ΔI). For example, the processor 300 may calculate the composite resistance (R) of the charging switch 50 and the discharging switch 30 using Equation 3 below. For example, if the accumulated voltage drop (ΔV) is 2 mV and the current integration value (ΔI) is 1 A, the composite resistance (R) of the charging switch 50 and the discharging switch 30 may be calculated as 2 mohm.

$$R = \frac{\Delta V}{\Delta I} \qquad \text{<Equation 3>}$$

Here, R may be a composite resistance, ΔV may be an accumulated voltage drop, and ΔI may be a current integration value.

In addition, the processor 300 may diagnose whether the state of at least one of the charging switch 50 and the discharging switch 30 is the drift state based on the composite resistance of the charging switch 50 and the discharging switch 30. Here, the drift state may be a phenomenon in which the turn-on state resistance of the switch is changed. For example, the processor 300 may repeatedly calculate the composite resistance at time intervals and store the calculated composite resistance. In addition, the processor 300 may diagnose whether the state of at least one of the charging switch 50 and the discharging switch 30 is the drift state by comparing the previously stored normal state composite resistance and the calculated composite resistance. For example, if the difference between the normal state composite resistance and the calculated composite resistance is beyond a preset range, the processor 300 may diagnose that at least one of the charging switch 50 and the discharging switch 30 is in the drift state.

In addition, the processor 300 may diagnose whether the state of at least one of the charging switch 50 and the discharging switch 30 is the drift state based on the composite resistance calculated at time intervals. For example, if the switch diagnosing apparatus according to an embodiment of the present disclosure is applied to a vehicle, the processor 300 may repeatedly calculate the composite resistance of the charging switch 50 and the discharging switch 30 at time intervals while the vehicle is running. In addition, the processor 300 may compare two different composite resistances calculated at a time interval. Also, if a difference between two different composite resistances calculated at a time interval is beyond a preset range, the processor 300 may diagnose that at least one of the charging switch 50 and the discharging switch 30 is in the drift state.

Through the above configuration, the switch diagnosing apparatus according to an embodiment of the present disclosure may effectively diagnose a drift state that may occur due to the change in resistance of the switch while the vehicle is running.

In addition, as shown in the configuration of FIG. 4, the switch diagnosing apparatus according to an embodiment of the present disclosure may include a diagnosis signaling unit 700.

The diagnosis signaling unit 700 may be electrically connected to the processor 300 to transmit an external short signal to the processor 300. Here, the external short signal may be a signal that simulates an external short situation such that the processor 300 recognizes the external short situation.

In addition, if the external short signal is received from the diagnosis signaling unit 700, the processor 300 may diagnose whether the charging switch 50 and the discharging switch 30 are normally opened, based on the measured voltage values of the first measurement point N1, the second measurement point N2 and the third measurement point N3. For example, in the external short situation, the processor 300 may turn off both the charging switch 50 and the discharging switch 30. In addition, the processor 300 may quickly diagnose whether both the charging switch 50 and the discharging switch 30 are opened based on the external short signal.

For example, the processor 300 may measure a measurement time taken to open both the charging switch 50 and the discharging switch 30, and compare the measurement time with a preset normal time to diagnose whether the difference between the measurement time and the normal time is within a preset value.

In addition, when the external short signal is received from the diagnosis signaling unit 700, the processor 300 according to an embodiment of the present disclosure may diagnose whether at least one of the charging switch 50 and the discharging switch 30 is normally open.

More specifically, if the external short signal is received from the diagnosis signaling unit 700, the processor 300 may recognize that an external short is generated. In addition, the processor 300 may transmit a turn-off command to the charging switch 50 and the discharging switch 30. Also, the processor 300 may diagnose whether at least one of the charging switch 50 and the discharging switch 30 is normally opened based on the measured voltage values of the first measurement point N1, the second measurement point N2 and the third measurement point N3.

The processor 300 may diagnose whether the discharging switch 30 is normally opened based on the measured voltage value of the first measurement point N1. More specifically, if the external short signal is received, the processor 300 may transmit a turn-off command to the discharging switch 30 and the charging switch 50. In addition, the processor 300 may diagnose whether the discharging switch 30 is normally opened by comparing the measured voltage value of the third measurement point N3 with the measured voltage value of the first measurement point N1.

For example, the processor 300 may diagnose whether the charging switch 50 and the discharging switch 30 are normally opened with reference to Table 1 below. Table 1 may be stored in the memory device 400.

TABLE 1

| Measured voltage value [V] of the third measurement point N3 | Measured voltage value [V] of the first measurement point N1 | Measured voltage value [V] of the second measurement point N2 | State of the discharging switch 30 | State of the charging switch 50 |
|---|---|---|---|---|
| A | 0 | 0 | opened | opened or closed |
| A | A | B | closed | Opened |
| A | A | A | closed | Closed |

Table 1 shows the states of the discharging switch 30 and the charging switch 50 according to the measured voltage values measured at the first measurement point N1, the second measurement point N2 and the third measurement point N3. Preferably, Table 1 shows the states of the discharging switch 30 and the charging switch 50 according to the measured voltage value measured when the cell assembly 10 is discharged.

Here, A[V] is the same value as the voltage value of the cell assembly 10 and may be, for example, 48V. B[V] is a voltage value that may be measured at the second measurement point N2 when the discharging switch 30 is turned on and the charging switch 50 is turned off. B [V] may be smaller than A[V] due to the voltage drop caused by the parasitic diode provided in the charging switch 50. For example, B [V] may be 47.3V due to the voltage drop caused by the parasitic diode.

Hereinafter, referring to FIG. 2 and Table 1, it will be described that the processor 300 diagnoses the states of the charging switch 50 and the discharging switch 30 after receiving an external short signal and transmitting a turn-off command to the charging switch 50 and the discharging switch 30. Here, the first diagnosis switch S1, the second diagnosis switch S2 and the third diagnosis switch S3 are all in an opened state.

The processor 300 may diagnose whether the discharging switch 30 is normally opened based on the measured voltage value of the third measurement point N3 and the measured voltage value of the first measurement point N1.

For example, if the potential difference of the positive electrode terminal voltage of the cell assembly 10 is A[V], the measured voltage value of the third measurement point N3 may be measured as A[V]. In this case, if the measured voltage value of the first measurement point N1 is A[V], the processor 300 may diagnose that the discharging switch 30 is not normally opened. That is, the processor 300 may diagnose that at least one of the plurality of discharging switches 30 is in the closed stuck state.

In addition, the processor 300 may diagnose the states of the discharging switch 30 and the charging switch 50 by comparing the measured voltage value of the first measurement point N1 with the measured voltage value of the second measurement point N2.

For example, if the potential difference of the positive electrode terminal voltage of the cell assembly 10 is A[V] and both the measured voltage value of the first measurement point N1 and the measured voltage value of the second measurement point N2 are A[V], the processor 300 may diagnose that the discharging switch 30 and the charging switch 50 are not normally opened. That is, the processor 300 may diagnose that at least one of the plurality of discharging switches 30 and at least one of the plurality of charging switches 50 are in the closed stuck state.

As another example, if the potential difference of the positive electrode terminal voltage of the cell assembly 10 is A[V], the measured voltage value of the first measurement point N1 is A[V] and the measured voltage value of the second measurement point N2 is B[V], the processor 300 may diagnose that the discharging switch 30 is not normally opened but the charging switch 50 is normally open. That is, the processor 300 may diagnose that at least one of the plurality of discharging switches 30 is in the closed stuck state and that the plurality of charging switches 50 is in the normal state.

As still another example, if the potential difference of the positive electrode terminal voltage of the cell assembly 10 is A[V] and both the measured voltage value of the first measurement point N1 and the measured voltage value of the second measurement point N2 are not A[V] or B[V], the processor 300 may diagnose that the discharging switch 30 is normally open. In this case, since the discharging switch 30 is normally opened, both the measured voltage values of the first measurement point N1 and the second measurement point N2 may be 0[V]. That is, the processor 300 may diagnose that the plurality of discharging switches 30 is in the normal state.

That is, the switch diagnosing apparatus according to an embodiment of the present disclosure has an advantage of protecting the internal circuit by quickly opening the discharging switch 30 and the charging switch 50 in an external short situation. Moreover, the switch diagnosing apparatus has an advantage of more specifically diagnosing the state of the charging switch 50 in consideration of the voltage drop caused by the parasitic diode provided in the charging switch 50.

The switch diagnosing apparatus according to the present disclosure may be applied to a battery management system (BMS). That is, the BMS according to the present disclosure may include the switch diagnosing apparatus of the present disclosure as described above. In this configuration, at least a part of the components of the switch diagnostic apparatus according to the present disclosure may be implemented by supplementing or adding functionality of components included in the conventional BMS. For example, the processor 300 and the memory device 400 of the switch diagnosing apparatus according to the present disclosure may be implemented as components of the BMS.

In addition, the switch diagnosis apparatus according to the present disclosure may be provided to a battery pack. That is, the battery pack according to the present disclosure may include the switch diagnosing apparatus of the present disclosure as described above. Here, the battery pack may include at least one secondary battery, the switch diagnosing apparatus, electrical components (including a BMS, a relay, a fuse, and the like), and a case.

Figure 5:
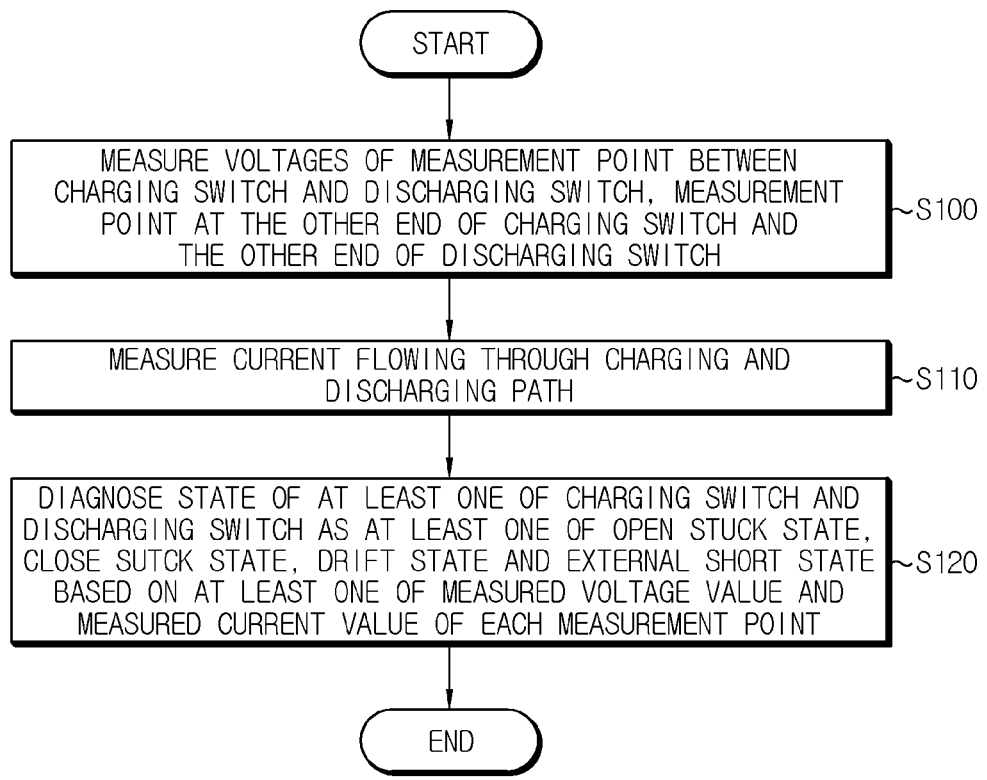
FIG. 5 is a flowchart for schematically illustrating a switch diagnosing method according to an embodiment of the present disclosure.

FIG. 5 is a flowchart for schematically illustrating a switch diagnosing method according to an embodiment of the present disclosure. In FIG. 5, a subject that executes each step may be each component of the switch diagnosing apparatus according to the present disclosure as described above.

As shown in FIG. 5, the switch diagnosing method according to the present disclosure includes a voltage measuring step S100, a current measuring step S110 and a switch diagnosing step S120.

First, in the voltage measuring step S100, the voltages of the measurement point between the charging switch and the discharging switch, the measurement point at the other end of the charging switch and the measurement point at the other end of the discharging switch may be measured, respectively. Subsequently, in the current measuring step S110, the current flowing through the charging and discharging path may be measured. Subsequently, in the switch diagnosing step (S120), the charging switch and the discharging switch may be selectively controlled to be opened or closed, the measured voltage value of each measurement point measured in the voltage measuring step may be received, the measured current value measured in the current measuring step may be received, and the state of at least one of the charging switch and the discharging switch may be diagnosed as at least one of the open stuck state, the closed stuck state, the drift state and the external short state based on at least one of the measured voltage value and the measured current value of each measurement point.

Preferably, in the switch diagnosing step S120 according to an embodiment of the present disclosure, it is possible to respectively calculate both-end voltage differences of the charging switch and the discharging switch based on the measured voltage value of each measurement point, and diagnose whether at least one of the charging switch and the discharging switch is in the open stuck state based on the both-end voltage difference of the charging switch and the discharging switch.

Preferably, in the switch diagnosing step (S120) according to an embodiment of the present disclosure, it is possible to measure the measured temperature value of each of the plurality of charging switches 50 and the plurality of discharging switches 30, and diagnose whether the plurality of charging switches 50 and the plurality of discharging switches 30 are in the open stuck state based on the measured temperature value and the both-end voltage differences of the charging switch and the discharging switch.

Preferably, in the switch diagnosing step (S120) according to an embodiment of the present disclosure, it is possible to diagnose whether at least one of the charging switch and the discharging switch is in the closed stuck state based on the measured voltage value of each measurement point.

Preferably, in the switch diagnosing step (S120) according to an embodiment of the present disclosure, it is possible to calculate a current integration value by integrating the measured current value during a preset reference time based on the measured current value, and calculate an accumulated voltage drop of the charging switch and the discharging switch during the reference time based on the measured voltage value. In addition, in the switch diagnosing step (S120) according to an embodiment of the present disclosure, it is possible to calculate a composite resistance of the charging switch and the discharging switch by dividing the accumulated voltage drop by the current integration value to and diagnose whether at least one of the charging switch and the discharging switch is in the drift state based on the composite resistance.

Preferably, in the switch diagnosing step (S120) according to an embodiment of the present disclosure, if an external short signal is received, it is possible to diagnose whether the charging switch and the discharging switch are normally opened based on the measured voltage value of each measurement point.

Also, when the control logic is implemented in software, the processor may be implemented as a set of program modules. At this time, the program modules may be stored in a memory device and executed by a processor.

In addition, there is no particular limitation on the types of various control logics of the processor, as long as one or more control logics are combined and the combined control logic is written in a computer-readable code system so that the computer-readable access is possible. As one example, the recording medium includes at least one selected from the group consisting of a ROM, a RAM, a register, a CD-ROM, a magnetic tape, a hard disk, a floppy disk and an optical data recording device. In addition, the code system may be stored and executed in a distributed manner on computers connected through a network. Moreover, functional programs, code and segments for implementing the combined control logics may be easily inferred by programmers in the technical field to which the present disclosure belongs.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

REFERENCE SIGNS

10: cell assembly
30: discharging switch
50: charging switch
100: voltage measuring unit
200: current measuring unit
300: processor
400: memory device
500: diagnosis power unit
600: temperature measuring unit
700: diagnosis signaling unit
L: charging and discharging path
N1: first measurement point
N2: second measurement point
N3: third measurement point
S1: first diagnosis switch
S2: second diagnosis switch
S3: third diagnosis switch

What is claimed is:

1. A switch diagnosing apparatus, which diagnoses a first charging switch and a first discharging switch on a charging and discharging path of a cell assembly and connected in series with each other, the apparatus comprising:
   a voltage measuring unit configured to measure voltages at both ends of the first charging switch and at both ends of the first discharging switch;
   a current measuring unit configured to measure a current flowing through the charging and discharging path;
   a processor configured to selectively control the first charging switch and the first discharging switch to be opened or closed, receive the measured voltages at both ends of at least one of the first charging switch or the first discharging switch from the voltage measuring unit, receive the measured current from the current measuring unit, and diagnose a state of at least one of the first charging switch or the first discharging switch as at least one of a normal state, an open stuck state, a closed stuck state and a drift state based on at least one of the measured voltages and the measured current; and
   a diagnosis power unit having one end electrically connected to the charging and discharging path to supply a diagnosis power to at least one of the first charging switch or the first discharging switch,
   wherein the processor is further configured to:
      calculate a normal voltage difference across the first charging switch and a normal voltage difference across the first discharging switch based on current information of the diagnosis power output by the diagnosis power unit and previously stored resistance information of each of the first charging switch and the first discharging switch,
      calculate a measured voltage difference across the first charging switch based on the measured voltages at both ends of the first charging switch,
      calculate a measured voltage difference across the first discharging switch based on the measured voltages at both ends of the first discharging switch
      diagnose whether the state of the first charging switch is the open stuck state based on a comparison between the measured voltage difference across the first charging switch and the normal voltage difference of the first charging switch, and
      diagnose whether the state of the first discharging switch is the open stuck state based on a comparison between the measured voltage difference across the first discharging switch and the normal voltage difference of the first discharging switch.

2. The switch diagnosing apparatus according to claim 1, further comprising:
   a diagnosis signaling unit electrically connected to the processor and configured to transmit an external short signal to the processor,
   wherein the processor is configured to determine that an external short occurs when the external short signal is received from the diagnosis signaling unit, and diagnose whether the charging switch and the discharging switch are normally opened in response to determination of an occurrence of an external short.

3. The switch diagnosing apparatus according to claim 2, wherein when the external short signal is received from the diagnosis signaling unit, the processor is configured to:
   transmit a turn-off command to each of the charging switch and the discharging switch; and
   diagnoses whether the charging switch and the discharging switch are normally opened based on the measured the measured voltages at both ends of the first charging switch and the first discharging switch.

4. The switch diagnosing apparatus according to claim 1, wherein the processor is configured to:
   calculate a measured voltage difference across the first charging switch based on the measured voltages at both ends of the first charging switch and a measured voltage difference across the first discharging switch based on the measured voltages at both ends of the first discharging switch; and
   diagnose the state of at least one of the first charging switch and the first discharging switch as at least one of a normal state, an open stuck state and a closed stuck state based on the calculated measured voltage difference across the first charging switch and the calculated measured voltage difference across the first discharging switch.

5. The switch diagnosing apparatus according to claim 4, further comprising:
a plurality of charging switches including the first charging switch connected in parallel with each other;
a plurality of discharging switches including the first discharging switch connected in parallel with each other, and
a temperature measuring unit positioned adjacent to each of the plurality of charging switches and the plurality of discharging switches to measure a temperature of each of the plurality of charging switches and the plurality of discharging switches.

6. The switch diagnosing apparatus according to claim 5, wherein the processor is configured to receive the measured temperatures of each of the plurality of charging switches and the plurality of discharging switches from the temperature measuring unit; and
diagnose the state of each of the plurality of charging switches and the plurality of discharging switches based on the received measured temperatures and measured voltage differences across each of the plurality of charging switches and the plurality of discharging switches.

7. The switch diagnosing apparatus according to claim 4, wherein the voltage measuring unit is electrically connected to a first measurement point between a first end of the charging switch and a first end of the discharging switch, a second measurement point at a second end of the charging switch and a third measurement point at a second end of the discharging switch to measure a voltage of each of the first, second and third measurement points.

8. The switch diagnosing apparatus according to claim 7, wherein the processor is configured to diagnose the state of at least one of the charging switch or the discharging switch based on the measured voltages of each of the first, second and third measurement points.

9. The switch diagnosing apparatus according to claim 1, wherein the processor is configured to:
calculate a current integration value by integrating the measured current during a preset reference time;
calculate each of an accumulated voltage drop of the charging switch and an accumulated voltage drop of the discharging switch during the reference time based on the measured voltages at both ends of the first charging switch and the first discharging switch.

10. The switch diagnosing apparatus according to claim 9, wherein the processor is configured to:
calculate a composite resistance of the charging switch by dividing the accumulated voltage drop of the charging switch by the current integration value;
calculate a composite resistance of the discharging switch by dividing the accumulated voltage drop of the discharging switch by the current integration value; and
diagnose at least one of whether the state of the charging switch is the drift state based on the calculated composite resistance of the charging switch or whether the state of the discharging switch is the drift state based on the calculated composite resistance of the discharging switch.

11. A battery pack, comprising the switch diagnosing apparatus according to claim 1.

12. A switch diagnosing apparatus, which diagnoses a first charging switch and a first discharging switch on a charging and discharging path of a cell assembly and connected in series with each other, the apparatus comprising:
a voltage measuring unit configured to measure voltages at both ends of the first charging switch and at both ends of the first discharging switch;
a current measuring unit configured to measure a current flowing through the charging and discharging path; and
a processor configured to selectively control the first charging switch and the first discharging switch to be opened or closed, receive the measured voltages at both ends of at least one of the first charging switch or the first discharging switch from the voltage measuring unit, receive the measured current from the current measuring unit, diagnose a state of at least one of the first charging switch or the first discharging switch as at least one of a normal state, an open stuck state, a closed stuck state and a drift state based on at least one of the measured voltages and the measured current;
wherein the processor is further configured to:
calculate a measured voltage difference across the first charging switch based on the measured voltages at both ends of the first charging switch and a measured voltage difference across the first discharging switch based on the measured voltages at both ends of the first discharging switch; and
diagnose the state of at least one of the first charging switch and the first discharging switch as at least one of a normal state, an open stuck state and a closed stuck state based on the calculated measured voltage difference across the first charging switch and the calculated measured voltage difference across the first discharging switch, and
wherein the apparatus further comprises:
a plurality of charging switches including the first charging switch connected in parallel with each other;
a plurality of discharging switches including the first discharging switch connected in parallel with each other; and
a temperature measuring unit positioned adjacent to each of the plurality of charging switches and the plurality of discharging switches to measure a temperature of each of the plurality of charging switches and the plurality of discharging switches.

13. The switch diagnosing apparatus according to claim 12,
wherein the processor is configured to:
calculate a current integration value by integrating the measured current during a preset reference time;
calculate each of an accumulated voltage drop of the charging switch and an accumulated voltage drop of the discharging switch during the reference time based on the measured voltages at both ends of the first charging switch and the first discharging switch.

14. The switch diagnosing apparatus according to claim 13,
wherein the processor is configured to:
calculate a composite resistance of the charging switch by dividing the accumulated voltage drop of the charging switch by the current integration value;
calculate a composite resistance of the discharging switch by dividing the accumulated voltage drop of the discharging switch by the current integration value; and
diagnose at least one of whether the state of the charging switch is the drift state based on the calculated composite resistance of the charging switch or whether the state of the discharging switch is the drift state based on the calculated composite resistance of the discharging switch.

15. The switch diagnosing apparatus according to claim 12, further comprising:
   a diagnosis signaling unit electrically connected to the processor and configured to transmit an external short signal to the processor,
   wherein the processor is configured to determine that an external short occurs when the external short signal is received from the diagnosis signaling unit, and diagnose whether the charging switch and the discharging switch are normally opened in response to determination of an occurrence of an external short.

16. The switch diagnosing apparatus according to claim 15,
   wherein when the external short signal is received from the diagnosis signaling unit, the processor is configured to:
   transmit a turn-off command to each of the charging switch and the discharging switch; and
   diagnoses whether the charging switch and the discharging switch are normally opened based on the measured the measured voltages at both ends of the first charging switch and the first discharging switch.

17. The switch diagnosing apparatus according to claim 12,
   wherein the processor is configured to receive the measured temperatures of each of the plurality of charging switches and the plurality of discharging switches from the temperature measuring unit; and
   diagnose the state of each of the plurality of charging switches and the plurality of discharging switches based on the received measured temperatures and measured voltage differences across each of the plurality of charging switches and the plurality of discharging switches.

18. The switch diagnosing apparatus according to claim 12,
   wherein the voltage measuring unit is electrically connected to a first measurement point between a first end of the charging switch and a first end of the discharging switch, a second measurement point at a second end of the charging switch and a third measurement point at a second end of the discharging switch to measure a voltage of each of the first, second and third measurement points.

19. The switch diagnosing apparatus according to claim 18,
   wherein the processor is configured to diagnose the state of at least one of the charging switch or the discharging switch based on the measured voltages of each of the first, second and third measurement points.

20. A battery pack, comprising the switch diagnosing apparatus according to claim 12.

* * * * *